(12) United States Patent
Breme

(10) Patent No.: US 6,878,243 B2
(45) Date of Patent: Apr. 12, 2005

(54) METHOD AND APPARATUS FOR PRODUCING AN OPTICALLY EFFECTIVE SYSTEM OF LAYERS ON BOTH SIDES OF A SUBSTRATE

(75) Inventor: Frank Breme, Hausen am Albis (CH)

(73) Assignee: Satis Vacuum Industries Vertriebs AG, Baar (CH)

( * ) Notice: Subject to any disclaimer, the term of this patent is extended or adjusted under 35 U.S.C. 154(b) by 0 days.

(21) Appl. No.: 10/700,996

(22) Filed: Nov. 4, 2003

(65) Prior Publication Data

US 2004/0089537 A1 May 13, 2004

Related U.S. Application Data

(63) Continuation of application No. PCT/EP02/07141, filed on Jun. 28, 2002.

(30) Foreign Application Priority Data

Jul. 13, 2001 (EP) .......................................... 01810698

(51) Int. Cl.[7] .............................................. C23C 14/34
(52) U.S. Cl. ............................ 204/192.23; 204/192.12; 204/192.16; 204/192.26
(58) Field of Search ........................ 204/192.12, 192.16, 204/192.23, 192.26, 298.15, 298.27, 298.28

(56) References Cited

U.S. PATENT DOCUMENTS

| 5,427,671 | A | 6/1995 | Ahmed ................... 204/298.23 |
| 6,090,247 | A | 7/2000 | White et al. ........... 204/298.26 |
| 6,143,143 | A | 11/2000 | Walls et al. ........... 204/192.26 |

FOREIGN PATENT DOCUMENTS

DE       41 17 257 A1    12/1992    ........... C03C/17/34

OTHER PUBLICATIONS

M. Ruske et al., *Properties of $SiO_2$ and $Si_3N_4$ layers deposited by MF twin magnetron sputtering using different target materials*, Thin Solid Films 351 (1999) pp. 158–163.

H. K. Pulker, *Coating on Glass*, 2d Edition, Title page and pp. 441–443, Elsevier, Amsterdam, 1999.

*Primary Examiner*—Steven Versteeg
(74) *Attorney, Agent, or Firm*—Alston & Bird LLP

(57) ABSTRACT

A method and apparatus for producing an optically effective system of layers on a substrate, such as a lens for use in an optical device. A plasma supported sputter deposition process is employed which, for the purpose of reducing damage to the rear side (1b) first applies a protective layer (2) to the rear side and then applies a system of layers (3) on the front side (1a) of the substrate (1). The apparatus includes an evacuable sputter chamber and a substrate holder (5) with receiving elements (6) for the substrates, and the receiving elements are mounted to permit rotation about two mutually perpendicular axes.

17 Claims, 5 Drawing Sheets

METHOD AND APPARATUS FOR PRODUCING AN OPTICALLY EFFECTIVE SYSTEM OF LAYERS ON BOTH SIDES OF A SUBSTRATE

CROSS REFERENCE TO RELATED APPLICATION

This application is a continuation of copending International Application No. PCT/EP02/07141, filed 28 Jun. 2002, and which designates the U.S. The disclosure of said application is expressly incorporated herein by reference.

BACKGROUND OF THE INVENTION

The invention relates to a method and apparatus for producing an optically effective system of layers on a substrate, such as a lens used in an optical device.

To produce an optical device with defined optical properties, it is known to provide a substrate, in a predetermined way, with a system of layers comprising a plurality of layers with different optical properties, in particular different refractive indices. Depending on the structure of the system of layers, it is possible, for example, to substantially suppress the reflection or transmission in certain wavelength ranges. Systems of layers of this type are used, for example, as an antireflection coating for the lenses of spectacles or for optical filters or mirrors. Standard layer materials are in particular dielectric, such as silicon oxide or silicon nitride. Examples of the structure of antireflection coatings for spectacle lenses are described, for example, in H. Pulker, Optical Coatings on Glass, 2nd edition, Elsevier, Amsterdam 1999. To produce an optical device with a high quality, the individual layers of the layer system must have a predetermined thickness over the entire substrate surface. Furthermore, the substrate must have a predetermined surface structure.

By way of example, sputtering processes are used to produce thin layers, wherein a solid target is bombarded by an ion beam or with ions in a plasma, with the result that individual atoms are removed from the target and deposited on the substrate. To produce optical coatings, a reactive gas, e.g. oxygen or nitrogen, with which the atoms which are being deposited react, is often added to the sputtering gas, e.g. argon. For example, it is known from M. Ruske et al., Properties of $SiO_2$ and $Si_3N_4$ layers deposited by MF twin magnetron sputtering using different target materials, Thin Solid Films 351 (1999) 158–163 to produce optical layers of different compositions, e.g. $SiO_2$ and $Si_3N_4$, using a single target material by adding, for example, oxygen or nitrogen as reactive gas. In the case of sputtering, it is only possible to coat the side which faces the target. In the case of a substrate which is to be coated on both sides, e.g. a spectacle lens, therefore, the substrate is turned after the front side has been coated, in order for the rear side to be coated.

A problem with plasma-enhanced sputtering processes for producing optical layer systems on a substrate is what is known as the rear side loading, i.e. damage caused, for example, by abrasive material, decomposition, contamination and the like. While one side is being coated, the other side of the substrate undergoes undesired changes on account of the surrounding plasma. In particular, oxygen-containing plasmas damage the substrate surface. Oxygen-containing plasmas are used in all conventional reactive sputtering processes for the deposition of at least one layer material, e.g. of $SiO_2$. The rear side loading is critical for optical elements in which the front and rear sides have to be provided with a well defined system of layers. Also, the surface change can lead to the coating applied failing to bond permanently.

To protect the side which is not being treated from undesirable deposits, it is known to insert the substrate in as tightly fitting a manner as possible into a substrate holder, so that the side which is not being treated does not come into contact with the plasma or the target material. For this purpose, the contour of the substrate holder is matched to the shape of the surface of the substrate in such a way that there is distance of at most 2 mm (dark space distance) between them and it is impossible for any plasma to form in this region. Since the curvatures of ophthalmic lenses vary greatly, a large number of different substrate holders are required and these substrate holders have to be checked and if necessary replaced each time before they are loaded.

It is known from U.S. Pat. No. 6,143,143 to protect that side of an optical lens which is not currently being sputter-coated from undesirable deposits by mechanical means. To do this, it is proposed for the opposite side from the side which is being sputter-coated to be covered either by sticking on a membrane or by the application of a protective gel or spray. A further solution proposed is a substrate holder made from an elastic material, e.g. foam or neoprene, which nestles closely against the substrate. A drawback in this case is the high level of outlay involved in fitting the material and then removing it again in order for the other side to be coated. For this purpose, the sputtering chamber has to be vented during the process. Furthermore, material such as the stuck-on membrane may disrupt the reaction conditions in the sputtering chamber and lead to undesirable deposits or changes in the structure of the layers.

The invention is therefore based on the object of providing a plasma-enhanced sputtering process for the production of an optically effective system of layers on an areal substrate, in which damage to the rear side of the substrate or to the system of layers deposited thereon is substantially avoided. Furthermore, it is intended to provide an apparatus for carrying out the method.

SUMMARY OF THE INVENTION

The above and other objects and advantages are achieved by the provision of a method and apparatus for producing an optically effective system of layers on a substrate having generally parallel first, e.g. front, and second, e.g. rear, sides. The substrate may be an areal, transparent substrate, e.g. an optical element made from plastic or glass. Prior to coating the first side of the substrate, a protective layer is applied to the second side by means of a sputter deposition process, or the substrate is selected which has had a protective layer already applied to the second side. After the protective layer has been applied to the second side, the substrate is turned in order to permit a system of layers to be applied to the first side by means of a sputter deposition process. After the system of layers has been applied to the first side, the substrate is turned, if necessary, to permit a further system of layers to be applied to the second side.

The protective layer protects the second side of the substrate from undesirable changes caused by the reactive atmosphere during the coating of the first side. It may be formed by a single layer or by an additional system of layers applied to the second side. The protective layer, apart from any partial degradation during the application of further layers, remains permanently on the substrate. Therefore, unlike known protective films, the protective layer according to the invention is permanent. Since the protective layer is preferably integrated in the function of the system of layers which is to be produced, there is no need for a step of removing, for example, a protective film.

It is preferable for the protective layer to be sputtered onto the second side. The method has particular advantages if it takes place within the apparatus used to produce the system of layers on the first side, since it is then not necessary to evacuate the sputtering chamber again and the two sides can be processed immediately after one another. After the protective layer has been applied, the substrate is turned, preferably automatically, in order for the front side to be coated by sputtering.

The process conditions used during the production of the protective layer and its thickness and material are selected in such a way that the first side of the substrate is not adversely affected by the initial production of the protective layer on the second side, and a sufficient protective action is produced since at most the protective layer and not the substrate is worn down during the coating of the first side. The first condition is preferably satisfied if the protective layer is deposited in a nitrogen-containing plasma and consists, for example, of silicon nitride $Si_xN_y$. If appropriate, it is also possible to use an oxygen plasma, since the loading on the first side can be controlled by keeping the deposition time short and/or by using elevated deposition pressures. A maximum thickness of approximately 40 nm (Nanometers) is preferred. The second condition is satisfied, for example, by the protective layer having a minimum thickness of approximately 10 nm.

When both sides of the substrate are being coated, in an advantageous refinement of the method, the protective layer serves as the first layer of a system of layers The protective layer consists, for example, of silicon oxide, silicon nitride, aluminum oxide and/or aluminum nitride. These materials have the advantage that the protective layer and the further layers with a high and low refractive index of the system of layers can be produced using a single silicon-containing or aluminum-containing target. If different targets are used, the first layer of the further system of layers to be applied to the second side, for example the standard highly refractive materials titanium oxide $TiO_2$, zirconium oxide $ZrO_2$, tantalum pentoxide $Ta_2O_5$, is in principle suitable for the protective layer.

When both sides of the substrate are being coated, in an advantageous refinement of the method the protective layer serves as the first layer of a system of layers which is to be applied to the second side. The production conditions are selected in such a way that the optical properties of the protective layer, after it has fulfilled its protective function, are matched to the conditions which are to be satisfied by the further system of layers. Any loss of material caused by the subsequent coating of the first side is taken into account. Particularly in the case of antireflection coatings, the bottom layer usually comprises a layer which is highly optically refractive, e.g. silicon nitride $Si_3N_4$, and can perform the function of the protective layer.

The method is particularly simple to carry out if the protective layer is produced using the same target which is also used to produce at least some and preferably all of the layers of the system of layers. In this case, the complete coating, including the protective layer, can be sputtered on without the target being exchanged. The materials of the individual layers with different refractive indices can be achieved by exchanging the reactive gases. By way of example, a pure silicon target or a silicon-aluminum target is used in plasma which alternately contains $O_2$ and $N_2$.

The apparatus according to the invention for carrying out the method comprises an evacuable sputtering chamber and a substrate holder with rotatable receiving elements for substrates, by means of which the substrates can be rotated both about a turning axis, which is oriented substantially parallel to the substrate surface, and about an axis of rotation, which is oriented substantially perpendicular to the substrate surface. In the case of a circular concave or convex substrate, the axis of rotation is, for example, the surface normal running through the vertex and the turning axis is a line perpendicular to this surface normal. If the target is stationary, the apparatus according to the invention allows the front side or the rear side of the substrates to be coated by sputtering as desired by the substrate being turned without the sputtering chamber being opened. The rotary movement is used to produce a homogeneous and uniform layer thickness distribution. It is particularly preferable for both movements to be realized using the same drive.

In addition to the complete coating of both sides of the substrate in a single installation, the invention is also eminently suitable for the final production of semi-finished or finished lenses by the optician through application of the coating desired by the customer. In this case, according to the invention, a coating which is also present on the substrate functions as a protective layer.

In what are known as semi-finished lenses, the front side delivered from the factory is already in a specific shape with the desired optical properties, while the rear side is individually machined by the optician by grinding in such a way that the lens satisfies the stipulations for each individual case, for example relating to refractive power and/or cylinder. With lenses of this type, the coatings are likewise to be applied by the optician. According to the invention, in a lens of this type first of all a complete antireflection layer system is applied to the front side, in this case the "second" side as described above, and functions as a protective layer. The rear side loading which occurs during production of this antireflection layer system is eliminated by the subsequent machining of the rear side. Then, an antireflection layer system is sputtered onto the rear side, in this case the "first" side as described above. The front side is then protected by the complete antireflection coating which has previously been applied. It is preferable for the system of layers which act as a protective layer to be sputtered onto the front side. However, the front side coating may also be carried out by the manufacturer in a separate large-scale installation, e.g. in what is known as a box coater. In this case, the system of layers can also be produced by means of electron beam evaporation.

As an alternative to the sequence outlined above, the rear side ("first" side) can be completely machined before the front side ("second" side) is coated with the system of layers which acts as a protective layer. After the protective layer has been applied, a hard coating is applied to the rear side, which may have been loaded, in order to improve the scratch resistance. This hard coating has no problems with bonding to a surface which may have been loaded but forms a load-free new surface for the system of layers which is subsequently sputtered on. This method can also be used to coat what are known as finished lenses, i.e. lenses with optics which have been predetermined by the manufacturer without subsequent machining which do not have a hard coating on the rear side.

It will be understood that the material and thickness of the system of layers or its top layer which is already acting as a protective layer, as described above, are selected in such a way that the optical properties are not adversely affected or are altered in a controlled way by the loading produced during application of the actual system of layers to the other side.

BRIEF DESCRIPTION OF THE DRAWINGS

Further exemplary embodiments of the invention are illustrated in the drawings, in which, purely diagrammatically.

DETAILED DESCRIPTION OF THE PREFERRED EMBODIMENTS

Figure 1A:
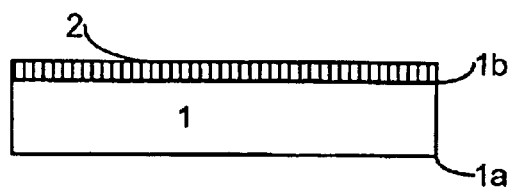
FIGS. 1A–E show the individual method steps involved in the coating of front and rear side of a substrate.
Figure 1B:
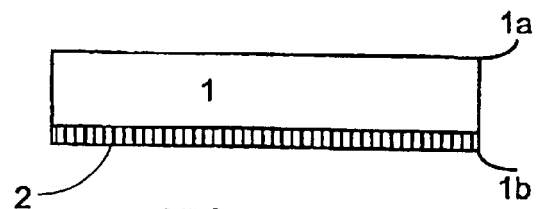

The text which follows describes an example of a method used to coat areal, transparent substrates 1, in particular spectacle lenses, with an antireflection layer 3, 4 on the front side 1a ("first" side) and the rear side 1b ("second" side) with reference to FIGS. 1A–E. The dimensions shown in the figures are purely diagrammatic; also, the curvature of the substrate 1 which is often present is not shown.

Typical gas flow rates are in the range, for example, from 2 to 50 sccm (standard cubic centimeters), but may also be lower or higher depending on the particular application and on the pump used. The resultant pressure in the coating chamber is in the range from $5 \cdot 10^{-2}$ to $8 \cdot 10^{-4}$ mbar. The plasma power is, for example, approximately 1.0–2.5 KW.

The sputtering method used is pulsed DC sputtering. In this case, the plasma is generated using an electron direct current which is switched on and off at a set frequency. During one period, the plasma is in each case switched off for a specific time (pulse pause time PPT).

The individual layers of the systems of layers 3, 4 are in each case deposited according to the following plan: firstly, the gas flows are set. After a short waiting time, e.g. 10 s, the plasma is ignited. A shutter between target and substrate 1 is opened after a further waiting time, e.g. 10 s, which is used to stabilize the plasma, for the predetermined coating time and is then closed.

First of all, the concave side 1b is sputter-coated with a protective layer 2 of $Si_xN_y$ in accordance with the invention. To do this, by way of example, the following process parameters are selected:

10 sccm of $Ar_2$, 30 scam of $N_2$, power: 1750 W, frequency: 90 kHz, pulse reverse time (PPT) : 5 µs. A coating time of 22 s leads to the deposition of a 15 nm thick $Si_xN_y$ layer 2 (FIG. 1A).

Figure 1C:
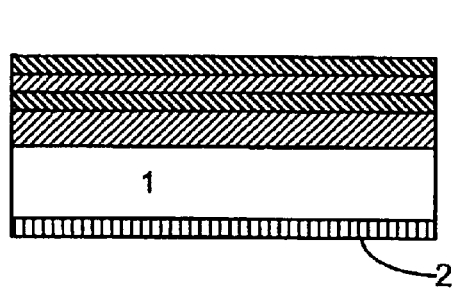
Figure 1D:
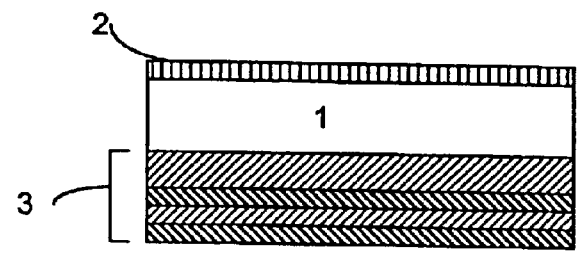
Figure 1E:
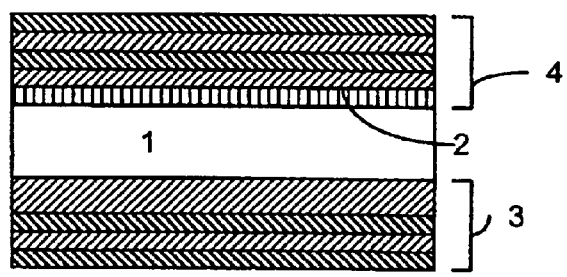
Figure 2:
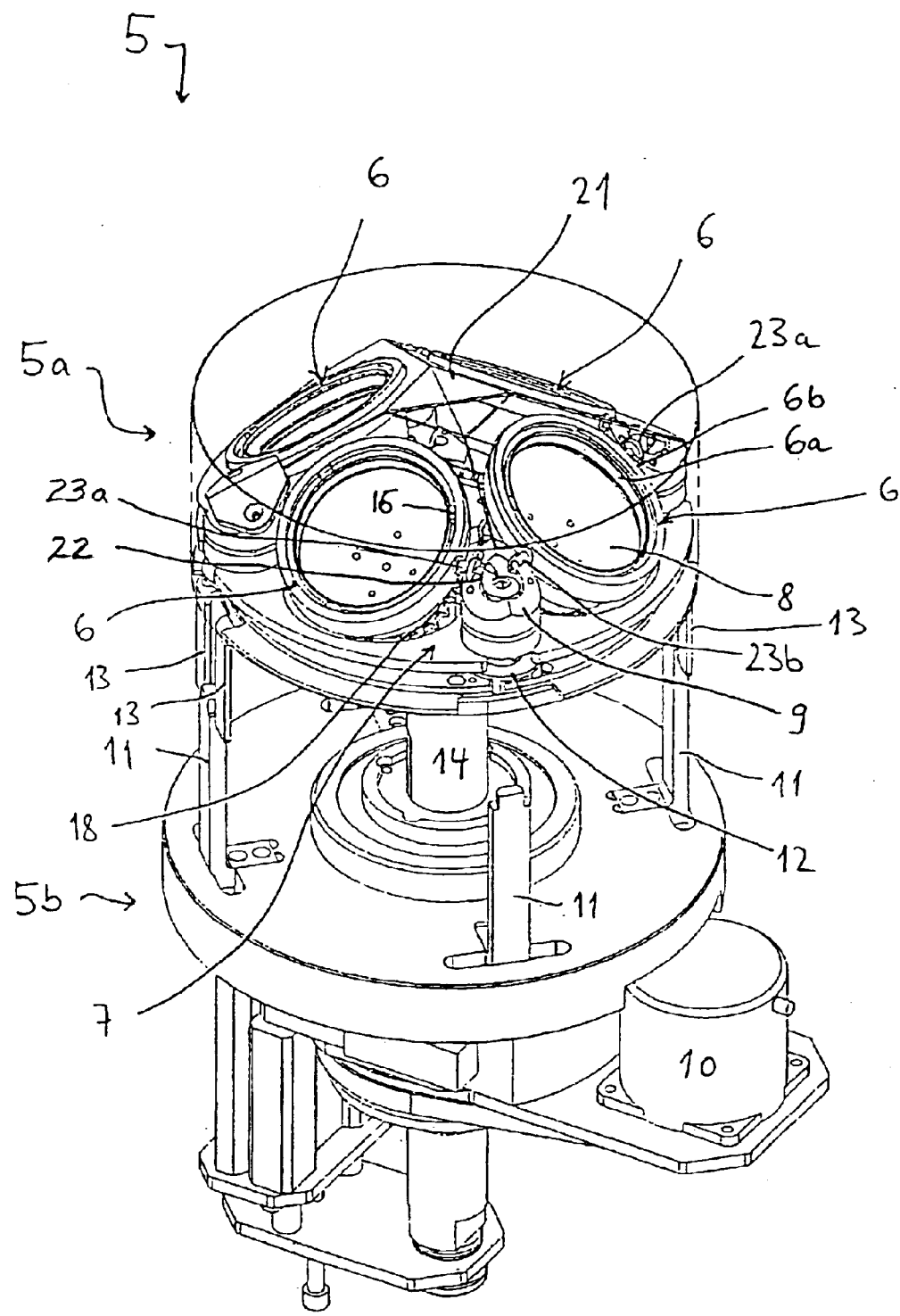
FIG. 2 shows a substrate holder according to the invention in a 3D view in the working position (coating)
Figure 3:
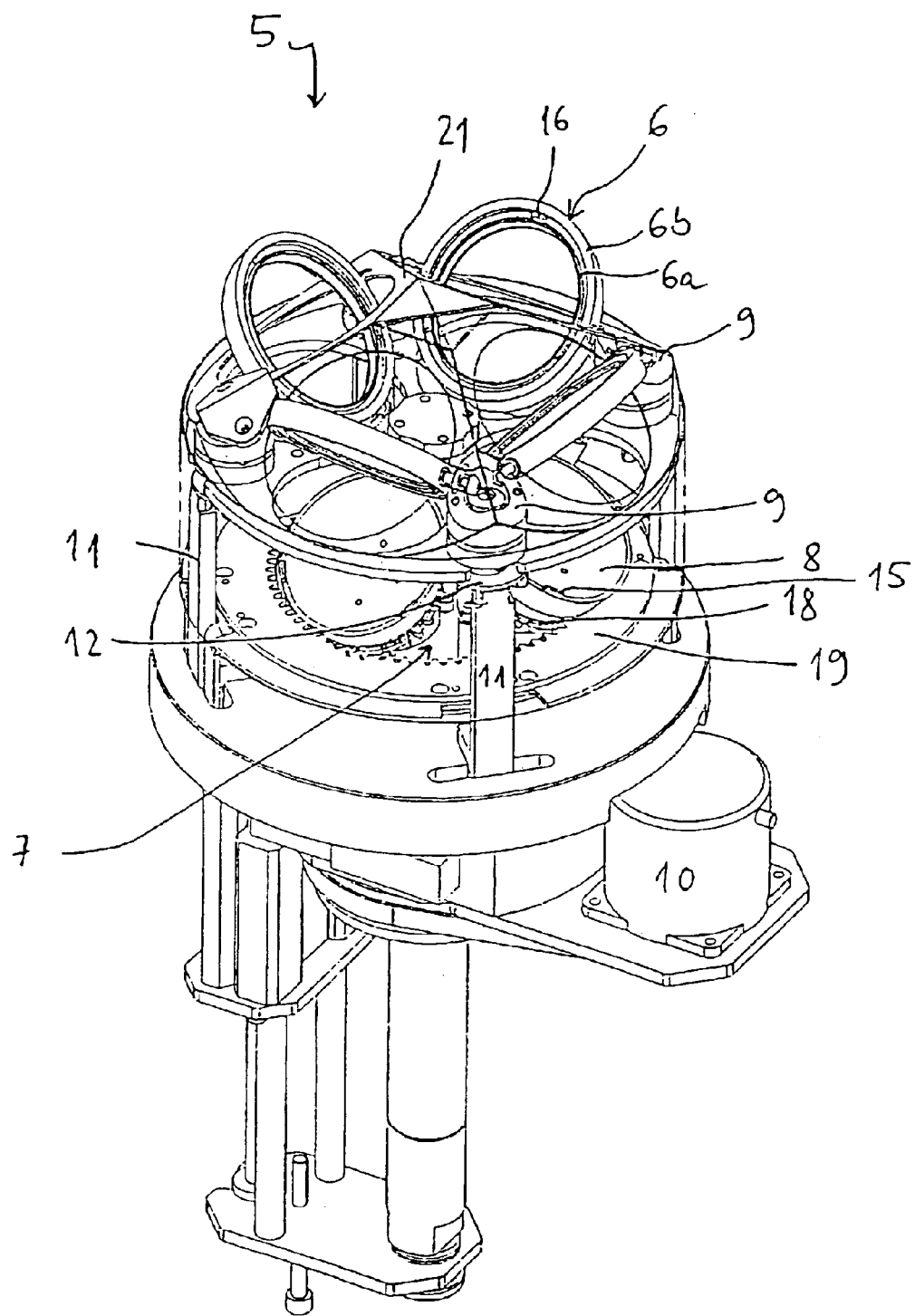
FIG. 3 shows the substrate holder shown in FIG. 2 in the turning position.
Figure 4:
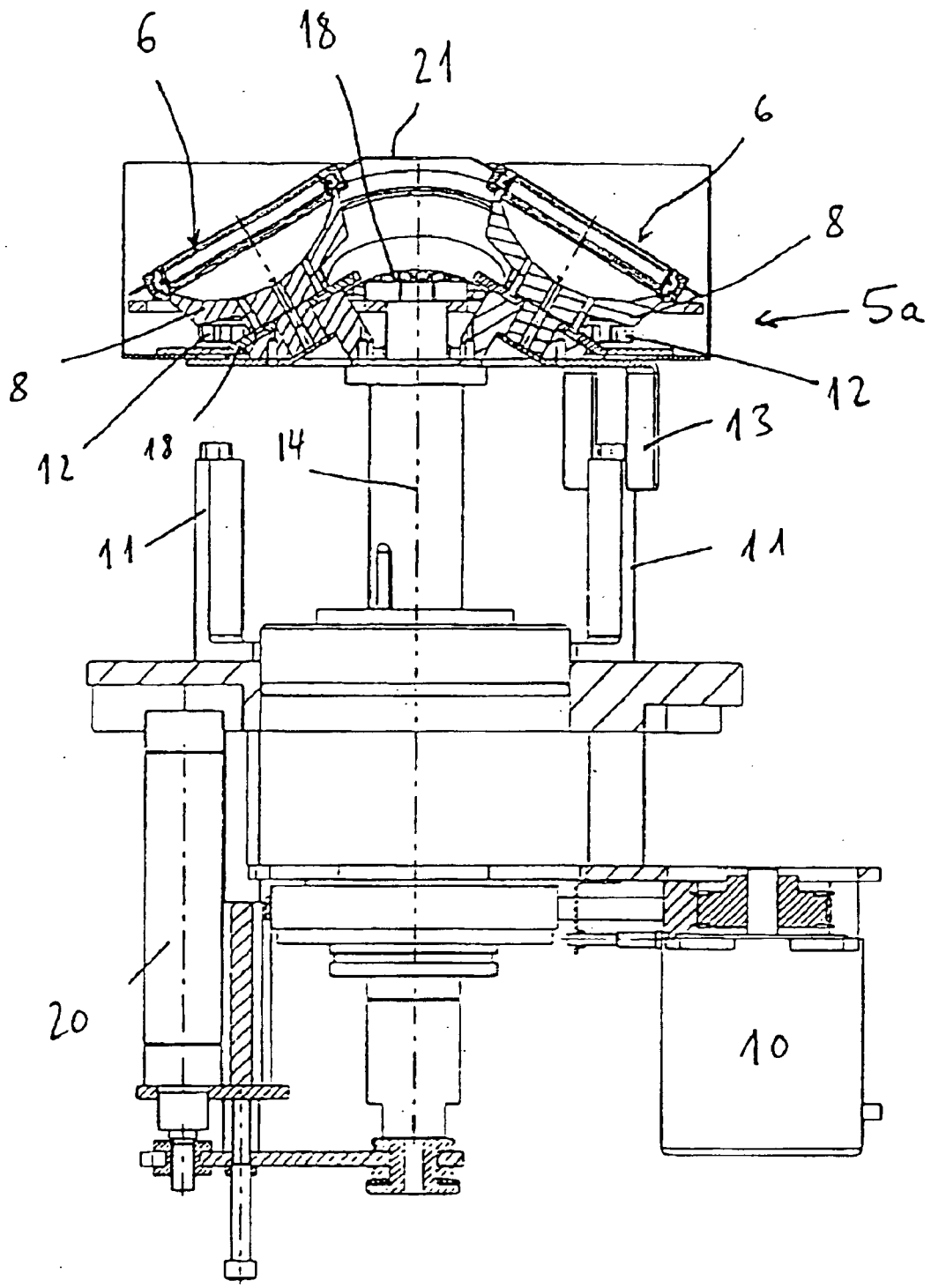
FIG. 4 shows the substrate holder from FIG. 2 in longitudinal section in the working position.
Figure 5:
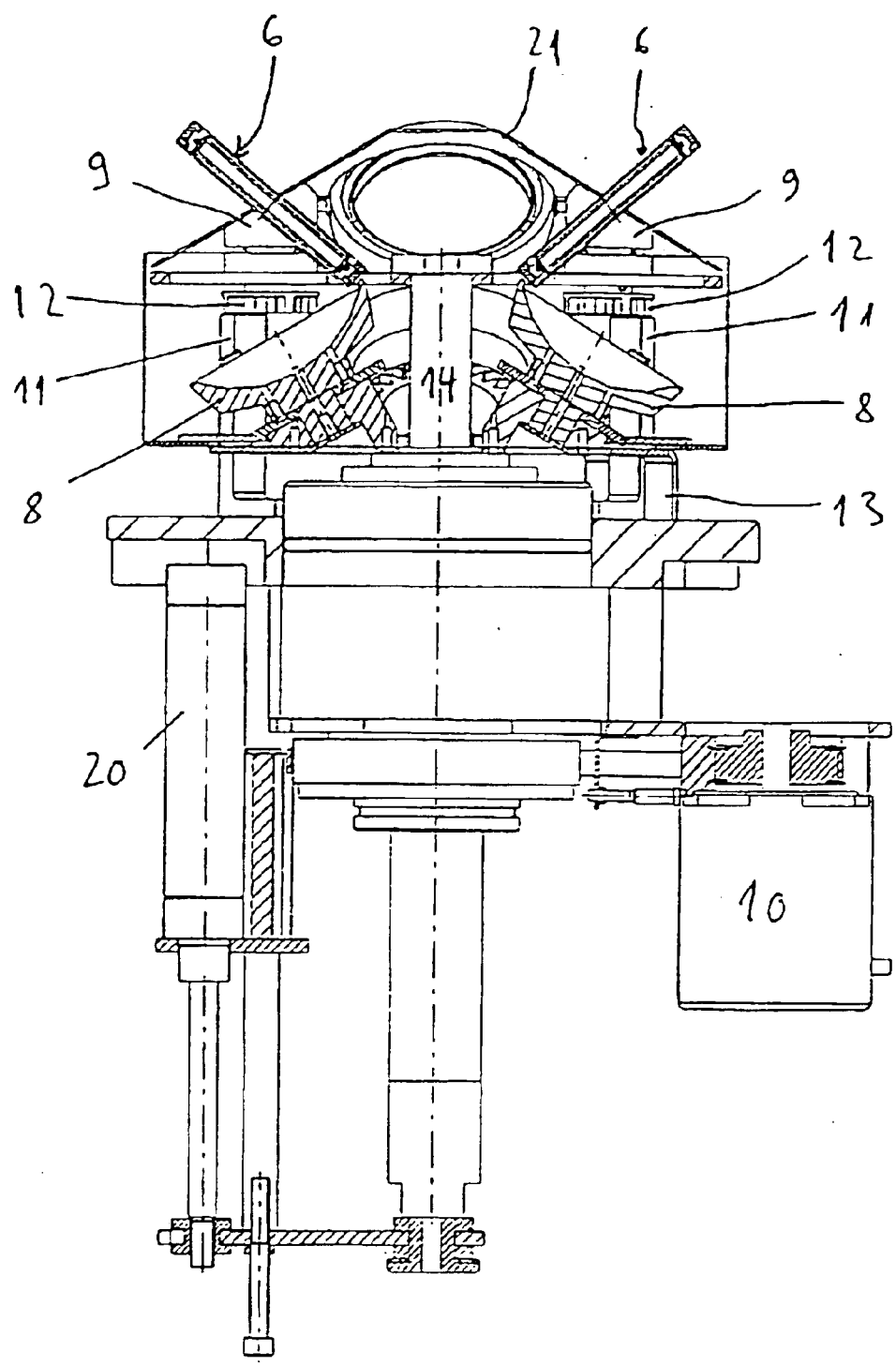
FIG. 5 shows the substrate holder from FIG. 2 in longitudinal section in the turning position.

Then, the substrate 1 is turned (FIG. 1B) and the convex side 1a is coated with an antireflection coating system 3, which in this case comprises four layers, in a manner which is known per se (FIG. 1C). A typical system of layers comprises, from the inside outward, for example, 35 nm of $Si_xN_y$, 20 nm of $SiO_2$, 61 nm of $Si_xN_y$, 92 nm of $SiO_2$.

For the $Si_xN_y$ layers, the process parameters, with the exception of the coating time, are selected, for example, to match the parameters used to produce the protective layer.

By way of example, the following parameters are selected for the $SiO_2$ layers: 10 sccm of $Ar_2$, 25 sccm of $O_2$; 1750 W, 90 kHz, 5 µs PPT.

The coating times (shutter in the "open" position) for the layers, from the inside outward are, for example: 1. 41 s, 2. 25 s, 3. 72 s, 4. 115 s.

After the complete system of layers has been deposited on the convex side, the substrate is turned again (FIG. 1D) and the concave side 1b is coated with the rest of the antireflection layer system 4 (FIG. 1E), which is identical to the system of layers 3 on the convex side 1a. The rear side loading of the plasma causes approximately 5 nm to be removed from the protective layer, so that 10 nm of $Si_xN_y$ still remain (thickness loss not illustrated). Therefore, the first layer deposited is 25 nm of $Si_xN_y$, followed by the remaining three layers as described above. This is diagrammatically indicated by the fact that the layer which adjoins the protective layer 2 in FIG. 1 has a lesser thickness than the corresponding inner layer of the system of layers 3. On account of the greater distance between the concave side of the lens and the target, the coating rates are lower by approximately 10%.

The coating times for the layers from the inside outward are, for example: 1. 32 s, 2. 27 s, 3. 79 s, 4. 126 s.

FIGS. 2–5 illustrate the substrate holder 5 as the principal component of a device according to the invention. In addition to the coating method according to the invention, it can also be used for all coating operations in which a substrate has to be both rotated and turned under a vacuum.

The substrate holder 5 comprises four annular receiving elements 6, into which the substrate, for example a spectacle lens, can be inserted in such a way that its main surfaces or the front and rear sides are accessible. The receiving elements 6 comprise an inner ring 6a and an outer ring 6b, which can rotate relative to one another. The inner ring 6a has cams 16 by means of which it can be set in rotation with respect to the outer ring. At its circumference, the outer ring 6b has two pins 23a, 23b, by means of which it is mounted in the cover 21 of the substrate holder 5. The pins 23a, 23b define the turning axis. One of the pins 23a is provided with a coupling element 22, e.g. a gear, and interacts with a turning drive 9 (cf. below).

In the working position (FIGS. 2 and 4), the receiving elements 6 rest on receiving dishes 8. These are part of a planetary gear mechanism 7 and are set in a rotary movement by a drive 10. This movement is transmitted to the inner ring 6a of the receiving elements 6 by the cam 16 on the inner ring 6a and cam 15 on the receiving dishes 8. The planetary gear mechanism 7 is driven by a shaft 14, which is coupled to the receiving dishes 8, being rotated by the drive 10. The receiving dishes 8 can rotate about their longitudinal axis and are rotated as a result of toothed rings 18 on the receiving dishes 8 rolling along an outer planetary gear 19, which does not also rotate, during rotation of the shaft. The outer planet gear 19 is held fixed in place by being at least indirectly connected to downwardly projected slot guides 13, with which a switching pin 11, which is arranged in a rotationally fixed manner at the lower part 5b of the substrate holder 5, interacts. The upper part 5a of the substrate holder 5 can be displaced relative to the lower part 5b by means of a lifting cylinder 20.

In the working position, the distance is such that although the switching pins 11 interact with the slot guide 13, so that the planetary gear mechanism is set in motion, the switching pins 11 do not project as far as into the region of the outer planet wheel 19. Therefore, in the working position, the receiving elements 6, as described, are rotated about an axis of rotation running through their center point.

To turn the receiving elements, the distance between the upper and lower parts 5a, 5b is reduced. The switching pins 11 then engage in the upper part 5a and press its cover 21, in which the receiving elements 6 are mounted, upward. The receiving elements 6 are in this way lifted out of the receiving dishes 8 and are no longer rotated. In this position, the coupling elements 22 of the receiving elements 6 are in engagement with in each case one turning drive 9. This is connected to in each case one indexing plate 12. As a result of the switching pin 11, in the turning position (short distance between the parts 5a and 5b), during rotation of the shaft and therefore of the turning drives 9 about the shaft longitudinal axis, periodically coming into contact with the indexing plate 12 or a cam arranged thereon, the turning drive is set in a rotary motion about its own longitudinal axis. This rotary motion is converted into the turning motion of the receiving elements 6 by the coupling element 22.

In this particular application, substantially only the upper part 5a and the switching pins 11 are located within the sputtering chamber. The common drive 10 means that only one passage for components which can move with respect to one another, in this case the shaft 14 and the sleeve which surrounds it, out of the vacuum chamber has to be produced and sealed.

With the substrate holder 5 described, it is possible for the method according to the invention to be carried out quickly and without any intervening venting. Since a plurality of substrates can be coated and turned simultaneously, it is possible to achieve a high throughput.

What is claimed is:

1. A method for producing an optical element comprising a substrate having a first side and a second side and at least one optically effective system of layers on said substrate, comprising the steps of applying a protective layer to the second side of the substrate by means of a sputter deposition process, or selecting a substrate which has had a protective layer already applied to the second side thereof, and then applying a system of layers to the first side of the substrate by means of a sputter deposition process, and wherein the protective layer, except for any partial degradation during application of the system of layers, remains permanently on the substrate, and wherein the protective layer is selected or produced in such a manner that its optical properties are matched to the conditions which are to be satisfied by the optical element.

2. The method as claimed in claim 1, wherein the protective layer is formed by a single layer or by an additional system of layers applied to the second side.

3. The method as claimed in claim 1, wherein after the system of layers has been applied on the first side, a further system of layers is applied onto the second side by means of a sputter deposition process.

4. The method as claimed in claim 3, wherein the protective layer is selected or produced in such a manner that its optical properties are matched to the conditions which are to be satisfied by the further system of layers.

5. The method as claimed in claim 3, wherein the protective layer is applied using the same target in the sputter deposition process which is also used to produce at least some layers of the system of layers applied on the first side and/or at least some of the layers of the further system of layers applied on the second side.

6. The method as claimed in claim 3, wherein the same target is used to produce the protective layer and the system of layers applied on the first side and/or the further system of layers applied on the second side, and with the process gas used in the sputter deposition processes in forming the layers of the systems of layers being selected as a function of the layer which is to be produced.

7. The method as claimed in claim 1, wherein the protective layer is applied onto the second side by means of a sputter deposition process.

8. The method as claimed in claim 7, wherein the protective layer is applied using a substantially oxygen-free plasma sputter deposition process.

9. The method as claimed in claim 1, wherein the composition of the protective layer is selected from the group consisting of silicon oxide, silicon nitride, aluminum oxide and/or aluminum nitride.

10. The method as claimed in claim 1, wherein the protective layer is applied with a thickness of 10 to 40 nm.

11. The method as claimed in claim 1, wherein the material of the protective layer and its thickness are selected in such a way, as a function of the process parameters during application of the system of layers to the first side, that after this layer system has been applied, the protective layer has a predetermined thickness.

12. The method as claimed in claim 1, wherein the step of applying a protective layer to the second side of the substrate includes applying a system of layers which acts as a protective layer, and wherein the first side is initially machined in order to obtain predetermined optical properties, and then the system of layers is applied to the first side.

13. A method for producing an optical element comprising a substrate having a first side and a second side and at least one optically effective system of layers on said substrate, comprising the steps of applying a protective layer to the second side of the substrate by means of a sputter deposition process, or selecting a substrate which has had a protective layer already applied to the second side thereof, and then applying a system of layers to the first side of the substrate by means of a sputter deposition process, and wherein the material of the protective layer and its thickness are selected in such a way, as a function of the process parameters during application of the system of layers to the first side, that after this layer system has been applied, the protective layer has a predetermined thickness.

14. A method for producing an optical element comprising a substrate having a first side and a second side and at least one optically effective system of layers on said substrate, comprising the steps of applying a protective layer to the second side of the substrate by means of a sputter deposition process, or selecting a substrate which has had a protective layer already applied to the second side thereof, and then applying a system of layers to the first side of the substrate by means of a sputter deposition process, and wherein the step of applying a protective layer to the second side of the substrate includes applying a system of layers which acts as a protective layer, and wherein the first side is initially machined in order to obtain predetermined optical properties, and then the system of layers is applied to the first side.

15. A method for producing an optical element comprising a substrate having a first side and a second side and at least one optically effective system of layers on said substrate, comprising the steps of applying a protective layer to the second side of the substrate by means of a sputter deposition process, and then applying a system of layers to the first side of the substrate by means of a sputter deposition process.

16. The method as claimed in claim 15, wherein the protective layer is applied using a substantially oxygen-free plasma sputter deposition process.

17. A method for producing an optical element comprising a substrate having a first side and a second side and at least one optically effective system of layers on said substrate, comprising the steps of applying a protective layer to the second side of the substrate by means of a sputter deposition process, or selecting a substrate which has had a protective layer already applied to the second side thereof, and then applying a system of layers to the first side of the substrate by means of a sputter deposition process, and wherein the composition of the protective layer is selected from the group consisting of silicon oxide, silicon nitride, aluminum oxide and/or aluminum nitride.

* * * * *